United States Patent
Heo et al.

(10) Patent No.: US 12,223,394 B2
(45) Date of Patent: Feb. 11, 2025

(54) METHOD AND APPARATUS FOR OPTIMIZING BIAS ERROR-BASED QUANTUM ERROR CORRECTION CODE

(71) Applicant: KOREA UNIVERSITY RESEARCH AND BUSINESS FOUNDATION, Seoul (KR)

(72) Inventors: Jun Heo, Seoul (KR); Jong Hyun Lee, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 18/253,244

(22) PCT Filed: Jan. 25, 2021

(86) PCT No.: PCT/KR2021/000978
§ 371 (c)(1),
(2) Date: May 17, 2023

(87) PCT Pub. No.: WO2022/107997
PCT Pub. Date: May 27, 2022

(65) Prior Publication Data
US 2023/0419159 A1    Dec. 28, 2023

(30) Foreign Application Priority Data
Nov. 17, 2020  (KR) .................. 10-2020-0153557

(51) Int. Cl.
*G06N 10/70* (2022.01)
(52) U.S. Cl.
CPC .................. *G06N 10/70* (2022.01)
(58) Field of Classification Search
CPC ........ G06N 10/70; G06N 20/00; G06F 11/16; H03M 13/00; H03M 13/03
(Continued)

(56) References Cited

U.S. PATENT DOCUMENTS

| 7,257,636 B2 | 8/2007 | Lee et al. |
| 8,441,916 B2 | 5/2013 | Shin et al. |

(Continued)

FOREIGN PATENT DOCUMENTS

| JP | 2020-530619 A | 10/2020 |
| KR | 10-0705445 B1 | 4/2007 |

(Continued)

OTHER PUBLICATIONS

Tuckett, David K., Stephen D. Bartlett, and Steven T. Flammia. "Ultrahigh error threshold for surface codes with biased noise." *Physical review letters* 120.5 (Jan. 31, 2018): 050505.

(Continued)

*Primary Examiner* — Albert Decady
*Assistant Examiner* — Osman M Alshack
(74) *Attorney, Agent, or Firm* — NSIP Law

(57) ABSTRACT

The present disclosure relates to a quantum error correction code and, more particularly, to a method and apparatus for optimizing a quantum error correction code in biased error environment. The method for optimizing a quantum error correction code, according to an embodiment of the present disclosure, may comprise the steps of: estimating, on the basis of a physical error rate ($p_{phy}$) and a bias degree ($\eta$), a logical error rate ($P_{fail}$) for each of one or more candidate lattice sizes; determining, on the basis of the estimated logical error rate ($P_{fail}$) and a target logical error rate ($P_{f,target}$), an optimal lattice size from among the one or more candidate lattice sizes; and arranging a Qubit on the basis of the optimal lattice size. Here, when the bias degree ($\eta$) exceeds 1, the one or more candidate lattice sizes may be defined in the form of a rectangular excluding a square.

11 Claims, 4 Drawing Sheets

(58) Field of Classification Search
USPC .......................................................... 714/746
See application file for complete search history.

(56) References Cited

U.S. PATENT DOCUMENTS

| | | | | |
|---|---|---|---|---|
| 10,956,829 | B1* | 3/2021 | Wei | G06N 10/00 |
| 11,436,398 | B2* | 9/2022 | Noh | G06N 10/20 |
| 2019/0199373 | A1* | 6/2019 | Heo | H03M 13/29 |
| 2020/0161531 | A1* | 5/2020 | Olivadese | H10N 60/805 |
| 2021/0019223 | A1* | 1/2021 | Chamberland | G06N 10/20 |
| 2021/0035006 | A1* | 2/2021 | Martinis | G06N 10/70 |
| 2021/0042652 | A1* | 2/2021 | Das | G06F 9/5016 |
| 2021/0117845 | A1* | 4/2021 | Choi | G06N 10/00 |
| 2021/0297362 | A1 | 9/2021 | Eckert et al. | |
| 2022/0101173 | A1* | 3/2022 | Alexander | G06N 10/00 |
| 2022/0156444 | A1* | 5/2022 | Noh | G06F 30/367 |
| 2022/0156622 | A1* | 5/2022 | Putterman | G06N 10/40 |
| 2022/0156630 | A1* | 5/2022 | Schuster | H10N 69/00 |

FOREIGN PATENT DOCUMENTS

| | | |
|---|---|---|
| KR | 10-2014-0071063 A | 6/2014 |
| KR | 10-1517361 B1 | 5/2015 |
| KR | 10-1768066 B1 | 8/2017 |
| KR | 10-2020-0035812 A | 4/2020 |
| WO | WO 2020-172538 A1 | 8/2020 |
| WO | WO 2020-180902 A1 | 9/2020 |

OTHER PUBLICATIONS

Greenbaum, Daniel, and Zachary Dutton. "Modeling coherent errors in quantum error correction." *Quantum Science and Technology* 3.1 (Dec. 20, 2017): 015007.

Lee, Jonghyun et al. Logical Error rate estimation under low physical error rate. The Journal of Korean institute of Communications and Information Sciences vol. 2020 No. 8 (J-KICS) Conference (2020).

* cited by examiner

METHOD AND APPARATUS FOR OPTIMIZING BIAS ERROR-BASED QUANTUM ERROR CORRECTION CODE

CROSS REFERENCE TO RELATED APPLICATIONS

This application is a U.S. National Stage Application of International Application No. PCT/KR2021/000978, filed on Jan. 25, 2021, which claims the benefit under 35 USC 119(a) and 365(b) of Korean Patent Application No. 10-2020-0153557, filed on Nov. 17, 2020, in the Korean Intellectual Property Office, the entire disclosure of which is incorporated herein by reference for all purposes.

TECHNICAL FIELD

The present disclosure relates to a quantum error correction code and specifically relates to a method and a device of optimizing a quantum error correction code in a biased error environment.

BACKGROUND ART

By applying a principle of quantum mechanics to computing and communication, significantly high-speed and absolute security may be provided theoretically compared to classical digital computing and communication. In order to overcome a difficulty in implementing quantum computing and quantum information communication due to a noise or an error in quantum information, fault-tolerant quantum information processing using a quantum error correcting code is being studied.

A quantum error includes a bit flip error and a phase flip error and a bit flip error may be referred to as a X error and a phase flip error may be referred to as a Z error. For fault-tolerant quantum computing, lots of error correction code studies have been conducted by assuming a situation in which a X error and a Z error generally occur with a uniform probability. But, actually, a Z error caused by dephasing occurs more frequently than a X error caused by an energy step change. Accordingly, an efficient quantum error correction code in a biased error environment is required and in particular, a specific method for optimizing a biased error-based quantum error correction code has not yet been prepared.

DISCLOSURE

Technical Problem

A technical problem of the present disclosure is to provide a method and a device of reducing an error rate of a quantum error correction code in a biased error environment.

An additional technical problem of the present disclosure is to provide a method and a device of estimating a logical error rate of a quantum error correction code in a biased error environment.

An additional technical problem of the present disclosure is to provide a method and a device of reducing the number of qubits required for a quantum error correction code in a biased error environment.

The technical objects to be achieved by the present disclosure are not limited to the above-described technical objects, and other technical objects which are not described herein will be clearly understood by those skilled in the pertinent art from the following description.

Technical Solution

A method of optimizing a quantum error correction code according to an aspect of the present disclosure may include estimating a logical error rate ($P_{fail}$) for each of at least one candidate lattice size based on a physical error rate ($p_{phy}$) and a bias degree ($\eta$); determining an optimal lattice size of the at least one candidate lattice size based on the estimated logical error rate ($P_{fail}$) and a target logical error rate ($P_{f,target}$); and arranging a qubit based on the optimal lattice size. Here, when the bias degree ($\eta$) exceeds 1, the at least one candidate lattice size may be defined in a rectangular form excluding a square.

A device of optimizing a quantum error correction code according to an additional aspect of the present disclosure may include a basic information acquisition unit which acquires basic information including at least one of a physical error rate ($p_{phy}$), a bias degree ($\eta$), at least one candidate lattice size, or a target logical error rate ($P_{f,target}$); a logical error rate estimation unit which estimates a logical error rate ($P_{fail}$) for each of the at least one candidate lattice size based on the physical error rate ($p_{phy}$) and the bias degree ($\eta$); a lattice size optimization unit which determines an optimal lattice size of the at least one candidate lattice size based on the estimated logical error rate ($P_{fail}$) and the target logical error rate ($P_{f,target}$); and a qubit arrangement unit which arranges a qubit based on the optimal lattice size. Here, when the bias degree ($\eta$) exceeds 1, the at least one candidate lattice size may be defined in a rectangular form excluding a square.

The characteristics which are simply summarized above for the present disclosure are just an illustrative aspect of a detailed description of the after-described present disclosure and do not limit a scope of the present disclosure.

Technical Effects

According to the present disclosure, a method and a device of reducing an error rate of a quantum error correction code in a biased error environment may be provided.

According to the present disclosure, a method and a device of estimating a logical error rate of a quantum error correction code in a biased error environment may be provided.

According to the present disclosure, a method and a device of reducing the number of qubits required for a quantum error correction code in a biased error environment may be provided.

Effects achievable by the present disclosure are not limited to the above-described effects, and other effects which are not described herein may be clearly understood by those skilled in the pertinent art from the following description.

DESCRIPTION OF DIAGRAMS

BEST MODE

Figure 1:
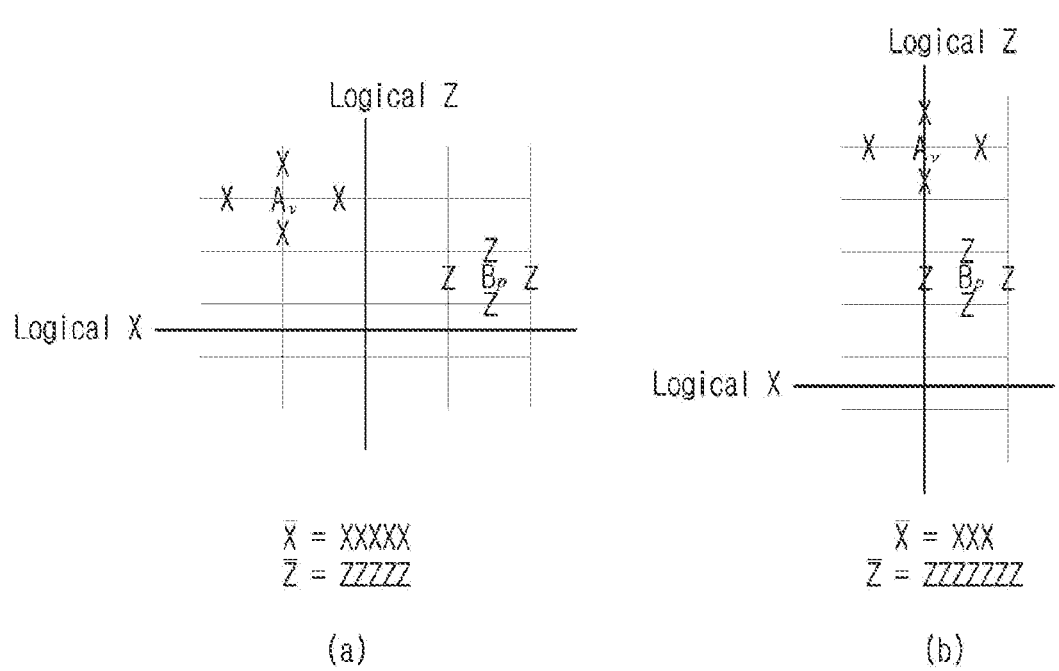
FIG. 1 represents examples on a qubit arrangement of an error correction code to which the present disclosure may be applied.

Hereinafter, an embodiment of the present disclosure will be described in detail so that those skilled in the pertinent art from the following description can easily carry it out by referring to an attached diagram. However, the present disclosure may be implemented in a variety of different forms and is not limited to an embodiment which is described herein.

In describing an embodiment of the present disclosure, when it is determined that a detailed description on a disclosure configuration or function could cloud a gist of the present disclosure, a detailed description thereon is omitted. In addition, a part irrelevant to a description on the present disclosure in a diagram is omitted and a similar diagram code is attached to a similar part.

In the present disclosure, when an element is referred to as being "connected", "combined" or "linked" to another element, it may include an indirect connection relation that yet another element presents therebetween as well as a direct connection relation. In addition, when an element is referred to as "including" or "having" another element, it means that another element may be additionally included without excluding another element unless otherwise specified.

In the present disclosure, a term such as first, second, etc. is used only to distinguish one element from other element and unless otherwise specified, it does not limit an order or importance, etc. between elements. Accordingly, within a scope of the present disclosure, a first element in an embodiment may be referred to as a second element in another embodiment and likewise, a second element in an embodiment may be referred to as a first element in another embodiment.

In the present disclosure, elements which are distinguished each other are to clearly describe each characteristic and do not mean that elements must be separated. In other words, a plurality of elements may be combined and configured in a unit of one hardware or software and one element may be distributed and configured in a unit of a plurality of hardware or software. Accordingly, even if separately mentioned, such a combined or distributed embodiment is also included in a scope of the present disclosure.

In the present disclosure, elements described in a variety of embodiments do not necessarily mean essential elements and some may be a selective element. Accordingly, an embodiment configured with a subset of elements described in an embodiment is also included in a scope of the present disclosure. In addition, an embodiment which additionally includes other element in elements described in a variety of embodiments is also included in a scope of the present disclosure.

Hereinafter, improvement of a logical error rate of a biased error-based quantum error correction code according to the present disclosure, a method of estimating a logical error rate, and a lattice shape for optimizing the number of qubits (i.e. reducing resources) are described.

A qubit, a basic unit of quantum computing operation, is more vulnerable to an error than a classical digital bit and in order to overcome it, development of a physical qubit with a low error rate, development of a large number of qubits enough to secure an error correction code and others are being conducted. A quantum error correction code is a tool for detecting and correcting an error occurring in a quantum channel by using an additional qubit. When a physical error rate is lower than a threshold, a distance of a code may increase to make a logical error rate close to 0. A quantum error correction code may be divided into a concatenated code and a topology-based surface code. Compared with a concatenated code, a surface code has a high threshold for an error rate required for a physical qubit and is configured with proximity operators to ensure that a quantum error correction code operates efficiently, so it is spotlighted as a future error correction code.

A variety of studies on a surface code are being conducted, but a study on an error correction code for a Z error-biased channel has not yet been implemented. Specifically, a X error and a Z error do not occur equally and a Z error-biased error mainly occurs in an ion trap qubit system, a superconducting qubit system, etc., which are an actual qubit system, but the existing quantum error correction technologies mostly do not consider a biased channel or a biased error environment. A technology considering some biased errors utilizes a machine learning technique and there is a problem that time and resources are required for model design, training, etc.

Embodiments according to the present disclosure describe a specific method which reduces a resource in a Z error-biased error channel and improves a logical error rate by considering a biased error-based error correction code, but modifying an arrangement of a qubit without using a machine learning technique.

Accordingly, compared with the existing error correction code assuming an error channel that a X error and a Z error occur with an equal probability, in the present disclosure, it is possible to operate more efficiently in an actual error channel by applying an error correction code assuming a Z error-biased error channel. In addition, in the present disclosure, an error correction code that a logical X operator and a logical Z operator are different may be configured to improve (i.e., reduce) a logical error rate in a Z error-biased error channel. In addition, in the present disclosure, a method of estimating a logical error rate for a biased error-based error correction code may be provided. In addition, in the present disclosure, the number of qubits required to achieve a desired (i.e., target) logical error rate may be minimized (i.e., resources may be reduced).

A logical operator of a widely known Toric surface code among surface codes to which the present disclosure may be applied may include a logical X operator and a logical Z operator. A parameter for error correction performance of each logical operator may be expressed as a distance and a minimum distance (d) may be referred to as a weight of a corresponding operator. A weight of a logical operator is associated with a logical error rate. For example, as a weight is higher, an error rate is improved. Meanwhile, as a weight of a logical operator is higher, an error rate is improved, but the number of qubits required for error correction (i.e., resources) increases.

When a biased error is not considered, a logical X operator and a logical Z operator have the same weight (=d). In addition, as more X errors occur, an error rate of a logical X operator increases and as more Z errors occur, an error rate of a logical Z operator increases.

FIG. 1 represents examples on a qubit arrangement of an error correction code to which the present disclosure may be applied.

A qubit may be positioned on an edge, a face and a vertex. A data qubit may be arranged on an edge, a Z stabilizer qubit (Bp) configured with Z operators may be arranged on a face and a X stabilizer qubit (Av) configured with 4 X operators may be generally arranged on a vertex. A logical X operator is defined as an operator which connects a horizontal boundary. A logical Z operator is defined as an operator which connects a vertical boundary.

FIG. 1(a) represents an example of a qubit arrangement of the existing surface code. The existing surface code assumes an error channel that a X error and a Z error occur equally (i.e., unbiased) and a two-dimensional qubit lattice is configured in a square form.

In an example of FIG. 1(a), a logical X operator may correspond to an operator which connects a left boundary and a right boundary which are a rough boundary. $\overline{X}$, a weight of a logical X operator, may correspond to the number of edges that a line connecting a left boundary and a right boundary passes and in this example, it may be $\overline{X}=XXXXX=5$. Here, a weight or a minimum distance of a logical X operator may correspond to $L_1$, a horizontal length of a lattice.

In an example of FIG. 1(a), a logical Z operator may correspond to an operator which connects an upper boundary and a lower boundary which are a smooth boundary. $\overline{Z}$, a weight or a minimum distance of a logical Z operator may correspond to the number of edges that a line connecting an upper boundary and a lower boundary passes and in this example, it may be $\overline{Z}=ZZZZZ=5$. Here, a weight or a minimum distance of a logical Z operator may correspond to $L_2$, a vertical length of a lattice.

Accordingly, in an example of FIG. 1(a), a lattice size may be defined as $L_1 \times L_2 = 5 \times 5$.

FIG. 1(b) represents an example of a qubit arrangement of a surface code according to the present disclosure. A surface code according to the present disclosure assumes an error channel that a X error and a Z error occur unequally (i.e., biased) and a two-dimensional qubit lattice is configured in a rectangular form excluding a square. In addition, in this example, it is assumed that a Z error occurs more frequently than a X error.

In an example of FIG. 1(b), a logical X operator may correspond to an operator which connects a left boundary and a right boundary which are a rough boundary. $\overline{X}$, a weight of a logical X operator, may correspond to the number of edges that a line connecting a left boundary and a right boundary passes and in this example, it may be $\overline{X}=XXX=3$. Here, a weight or a minimum distance of a logical X operator may correspond to $L_1$, a horizontal length of a lattice.

In an example of FIG. 1(b), a logical Z operator may correspond to an operator which connects an upper boundary and a lower boundary which are a smooth boundary. $\overline{Z}$, a weight or a minimum distance of a logical Z operator may correspond to the number of edges that a line connecting an upper boundary and a lower boundary passes and in this example, it may be $\overline{Z}=ZZZZZZZ=7$. Here, a weight or a minimum distance of a logical Z operator may correspond to $L_2$, a vertical length of a lattice.

Accordingly, a lattice size in an example of FIG. 1(b) may be defined as $L_1 \times L_2 = 3 \times 7$.

An example of FIG. 1(a) represents a qubit arrangement of the existing surface code based on an unbiased error and a qubit is arranged in a square lattice. Meanwhile, an example of FIG. 1(b) represents a qubit arrangement of a new surface code based on a biased error and a qubit is arranged in a rectangular lattice excluding a square. Compared with an example of FIG. 1(a), when a rectangular lattice structure as in an example of FIG. 1(b) is applied, a probability that a Z error occurs may be reduced.

Figure 2:
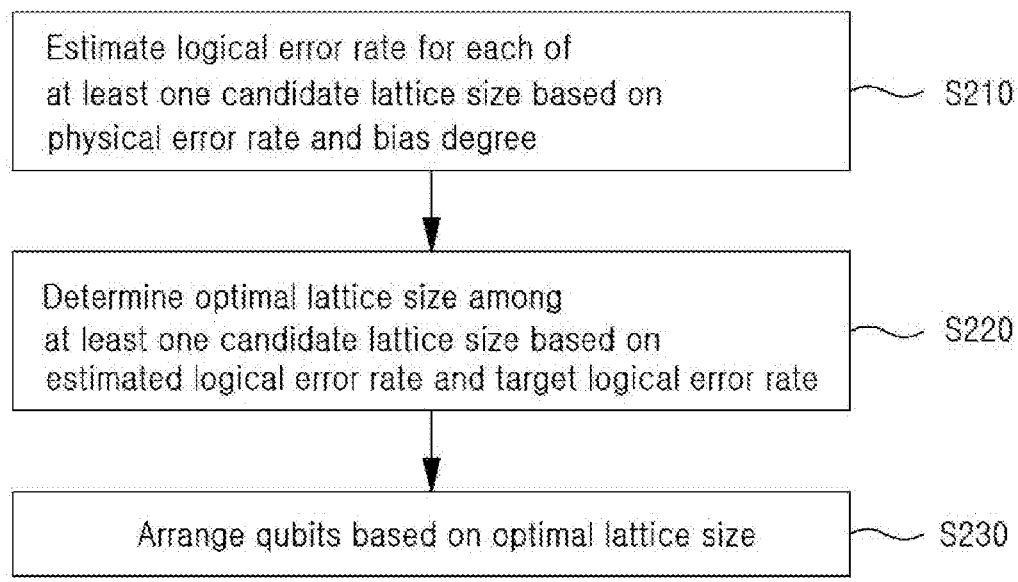
FIG. 2 is a flowchart for describing an example on a method of optimizing a biased error-based quantum error correction code to which the present disclosure may be applied.

FIG. 2 is a flowchart for describing an example on a method of optimizing a biased error-based quantum error correction code to which the present disclosure may be applied.

In S210, based on a physical error rate ($p_{phy}$) and a bias degree ($\eta$), a logical error rate ($P_{fail}$) for each of at least one candidate lattice size may be estimated. A physical error rate ($p_{phy}$) and a bias degree ($\eta$) may be configured (or given) in advance according to a characteristic of an error channel.

Here, a physical error rate ($p_{phy}$) may include a physical Z error rate ($p_Z$) and a physical X error rate ($p_X$). A bias degree ($\eta$) may be defined as $\eta = p_Z/p_X$.

When a bias degree ($\eta$) is 1, a lattice size may have a square shape, but the present disclosure assumes a case in which a bias degree exceeds 1 (i.e., a Z error rate occurs more frequently than a X error rate), so a size of each of the at least one candidate lattice may be defined in a rectangular form excluding a square. In other words, a size of each of the at least one candidate lattice may be defined in a form that a minimum distance ($L_2$) of a logical Z operator (or a weight of a logical Z operator or a vertical length of a lattice) is larger than a minimum distance ($L_1$) of a logical X operator (or a weight of a logical X operator or a horizontal length of a lattice).

A logical error rate ($P_{fail}$) may be defined as in the following Equation 1.

$$P_{fail} = 1-(1-P_{Lz})(1-P_{Lx}) = P_{Lz}+P_{Lx}-P_{Lz}P_{Lx} \qquad \text{[Equation 1]}$$

In Equation 1, $P_{Lx}$ may correspond to a logical X error rate and $P_{Lz}$ may correspond to a logical Z error rate.

A logical X error rate ($P_{Lx}$) may be estimated as in the following Equation 2.

$$P_{L_x} = L_2 \sqrt{\frac{2L_1}{\pi(L_1+1)^2} \times \left(\frac{4L_1^2}{L_1^2-1}\right)^{L_1}} \qquad \text{[Equation 2]}$$

$$P_{L_x} = \exp\left[\left(c_1\left(\frac{1}{\eta+1}p_{phy}-c_2\right)^2+c_3\right)L_1\right] \times \left[\left(\frac{c_4}{\eta+1}p_{phy}+c_5\right)L_2+c_6\left(\frac{1}{\eta+1}p_{phy}-c_7\right)^2+c_8\right)\right] \text{ for } p_X > p_{X,high}$$

$$\left(\frac{1}{\eta+1}p_{phy}\right)^{\lceil L_1/2 \rceil} \text{ for } p_X < p_{X,low}$$

In Equation 2, when a physical X error rate ($p_X$) is less than a first threshold value ($p_{X,low}$), a logical X error rate ($P_{Lx}$) may be determined based on a candidate lattice size $L_1$ and $L_2$, a physical error rate ($p_{phy}$) and a bias degree ($\eta$). $\lceil y \rceil$ means a minimum integer equal to or greater than y.

In Equation 2, when a physical X error rate ($p_X$) exceeds a second threshold value ($p_{X,high}$), a logical X error rate ($P_{Lx}$) may be determined based on a candidate lattice size $L_1$ and $L_2$, a physical error rate ($p_{phy}$), a bias degree ($\eta$) and predetermined constants. Here, predetermined constants $c_1$, $c_2$, $c_3$, $c_4$, $c_5$, $c_6$, $c_7$ and $c_8$ may be a value which is configured (or given) based on a characteristic of data. In other words, a value of constants of $c_1$ to $c_8$ may be determined according to a state or a value of data (or quantum data), a target of an experiment or simulation.

A first threshold value may be configured as an upper limit value of a logical error rate that an ideal or theoretical operation is predicted. A second threshold value may be configured as a lower limit value of a logical error rate that an experimental operation or an operation according to simulation is predicted.

A second threshold value may be greater than a first threshold value. In addition, a scope below a first threshold value may be replaced with a scope equal to or less than a first threshold value. In addition, a scope exceeding a second threshold value may be replaced with a scope equal to or greater than a second threshold value. A scope equal to or greater than (or exceeding) a first threshold value and equal to or less than (or below) a second threshold value corresponds to a scope that a logical error rate may not be estimated, so it is not considered in the present disclosure.

A logical Z error rate ($P_{L_z}$) may be estimated as in the following Equation 3.

$$P_{L_z} = L_1 \sqrt{\frac{2L_2}{\pi(L_2+1)^2} \times \left(\frac{4L_2^2}{L_2^2-1}\right)^{L_2}} \quad \text{[Equation 3]}$$

$$\left(\frac{\eta}{\eta+1} p_{phy}\right)^{\lceil L_2/2 \rceil} \quad \text{for } p_Z < p_{Z,low}$$

$$P_{L_z} = \exp\left[\left(c_1\left(\frac{\eta}{\eta+1}p_{phy} - c_2\right)^2 + c_3\right)L_2\right] \times \left[\left(\left(c_1\frac{\eta}{\eta+1}p_{phy} + c_2\right)^2 + c_3\right)\right.$$

$$\left. L_2 \times \left[\left(\frac{c_4\eta}{\eta+1}p_{phy} + c_5\right)L_1 + c_6\left(\frac{\eta}{\eta+1}p_{phy} - c_7\right)^2 + c_8\right]\right] \text{ for } p_Z > p_{Z,high}$$

In Equation 3, when a physical Z error rate ($p_Z$) is less than a third threshold value ($p_{Z,low}$), a logical Z error rate ($P_{L_z}$) may be determined based on a candidate lattice size $L_1$ and $L_2$, a physical error rate ($p_{phy}$) and a bias degree ($\eta$). $\lceil y \rceil$ means a minimum integer equal to or greater than y.

In Equation 3, when a physical Z error rate ($p_Z$) exceeds a fourth threshold value ($p_{Z,high}$), a logical Z error rate ($P_{L_z}$) may be determined based on a candidate lattice size $L_1$ and $L_2$, a physical error rate ($p_{phy}$), a bias degree ($\eta$) and predetermined constants. Here, predetermined constants $c_1$, $c_2$, $c_3$, $c_4$, $c_5$, $c_6$, $c_7$ and $c_8$ may be a value which is configured (or given) based on a characteristic of data. In other words, a value of constants of $c_1$ to $c_8$ may be determined according to a state or a value of data (or quantum data), a target of an experiment or simulation.

For example, a value of constants of $c_1$ to $c_8$ in Equation 2 and Equation 3 may be determined as values ensuring that an error between a simulation result data value and a value of a graph determined according to Equation 2 or 3 is within an allowable scope (or that an error or a sum of errors is minimal). For example, a value of $c_1$ to $c_8$ may be determined as in the following Table 1. A value of $c_1$ to $c_8$ in Table 1 is an exemplary value determined by considering a variety of lattice sizes, an error rate, etc. and a scope of the present disclosure is not limited to a specific value of $c_1$ to $c_8$.

TABLE 1

| $c_1$ | $c_2$ | $c_3$ | $c_4$ | $c_5$ | $c_6$ | $c_7$ | $c_8$ |
|---|---|---|---|---|---|---|---|
| −65.727 | −0.122 | −0.0682 | −0.172 | 0.065 | 0.190 | −6.070 | −7.407 |

A third threshold value may be configured as an upper limit value of a logical error rate that an ideal or theoretical operation is predicted. A fourth threshold value may be configured as a lower limit value of a logical error rate that an experimental operation or an operation according to simulation is predicted.

A fourth threshold value may be greater than a third threshold value. In addition, a scope below a third threshold value may be replaced with a scope equal to or less than a third threshold value. In addition, a scope exceeding a fourth threshold value may be replaced with a scope equal to or greater than a fourth threshold value. A scope equal to or greater than (or exceeding) a third threshold value and equal to or less than (or below) a fourth threshold value corresponds to a scope that a logical error rate may not be estimated, so it is not considered in the present disclosure.

In S220, based on a logical error rate ($P_{fail}$) and a target logical error rate ($P_{f,target}$) estimated in S210, an optimal lattice size of the at least one candidate lattice size may be determined. A target logical error rate ($P_{f,target}$) may be configured (or given) in advance as a value which serves as a standard for determining an optimal lattice size.

An optimal lattice size may be determined as in the following Equation 4.

$$\underset{L_1, L_2}{\operatorname{argmin}} \; 2L_1L_2 - L_1 - L_2 + 1 \quad \text{[Equation 4]}$$

$$\text{s.t. } P_{fail} \leq P_{f,target}$$

According to Equation 4, in order to satisfy a logical error rate ($P_{fail}$) equal to or less than a target logical error rate (Pf, target), a value of $L_1$ and $L_2$ (i.e., $L_{1,opt}$ and $L_{2,opt}$) which minimizes a value of a function of $2L_1L_2-L_1-L_2+1$ may be found.

In S230, a qubit may be arranged based on an optimal lattice size determined in S220. A quantum error correction code (e.g., a surface code) that a qubit is arranged in a lattice in an optimal lattice size (in particular, in a rectangular form with $L_{2,opt} > L_{1,opt}$) may minimize (or optimize) the number of required qubits simultaneously with reducing a probability that a Z error occurs in a Z error-biased environment.

As described by referring to an example of FIG. 2, when a target logical error rate ($P_{f,target}$), a physical error rate ($p_{phy}$), and a bias degree ($\eta$) are given, the number of necessary qubits may be optimized through a logical error rate estimation method for each different lattice size.

In addition, in order to estimate a logical X error rate and a logical Z error rate, a scope of a possible physical error rate may be divided into 2 scopes (below a first threshold value and exceeding a second threshold value for a logical X error rate, or below a third threshold value and exceeding a fourth threshold value for a logical Z error rate) to estimate a final logical error rate ($P_{fail}$).

An example to which a biased error-based quantum error correction code optimization method according to the present disclosure is applied may be represented as in the following Table 2.

TABLE 2

| $P_{f,\,target}$ | η | $p_{phy}$ | Optimal Lattice Size $L_{1,\,opt} \times L_{2,\,opt}$ | $P_{f,\,target}$ | Square Lattice Size |
|---|---|---|---|---|---|
| $10^{-2}$ | 2.5 | 0.11 | 9 × 19 | $6.38 \times 10^{-3}$ | 23 × 23 |
|  |  | 0.1 | 9 × 15 | $6.85 \times 10^{-3}$ | 19 × 19 |
|  | 2 | 0.11 | 9 × 17 | $7.22 \times 10^{-3}$ | 19 × 19 |
|  |  | 0.1 | 9 × 13 | $8.01 \times 10^{-3}$ | 15 × 15 |
| $10^{-3}$ | 2.5 | 0.1 | 13 × 29 | $6.07 \times 10^{-4}$ | 31 × 31 |

TABLE 2-continued

| $P_{f,\,target}$ | $\eta$ | $p_{phy}$ | Optimal Lattice Size $L_{1,\,opt} \times L_{2,\,opt}$ | $P_{f,\,target}$ | Square Lattice Size |
|---|---|---|---|---|---|
| | | 0.08 | 11 × 19 | $4.5 \times 10^{-4}$ | 21 × 21 |
| | 2 | 0.1 | 15 × 25 | $7.47 \times 10^{-4}$ | 27 × 27 |
| | | 0.08 | 11 × 17 | $5.23 \times 10^{-4}$ | 17 × 17 |

An example of Table 2 represents an optimal lattice size ($L_{1,opt}$ and $L_{2,opt}$) calculated for each combination of a case when a target logical error rate (Pf, target) is 10-2 and 10-3, when a bias degree ($\eta$) is 2.5 and 2, when a physical error rate ($p_{phy}$) is 0.11 and 0.1 or 0.1 and 0.08. For comparison, it represents a logical error rate ($P_{f,rect}$) for a square lattice size together as in a conventional method. Accordingly, a rectangular (i.e., $L_2 > L_1$) lattice size according to the present disclosure may achieve an effect of reducing the number of qubits by 36% to 69% compared to a square form (i.e., $L_1 = L_2$).

Figure 3:
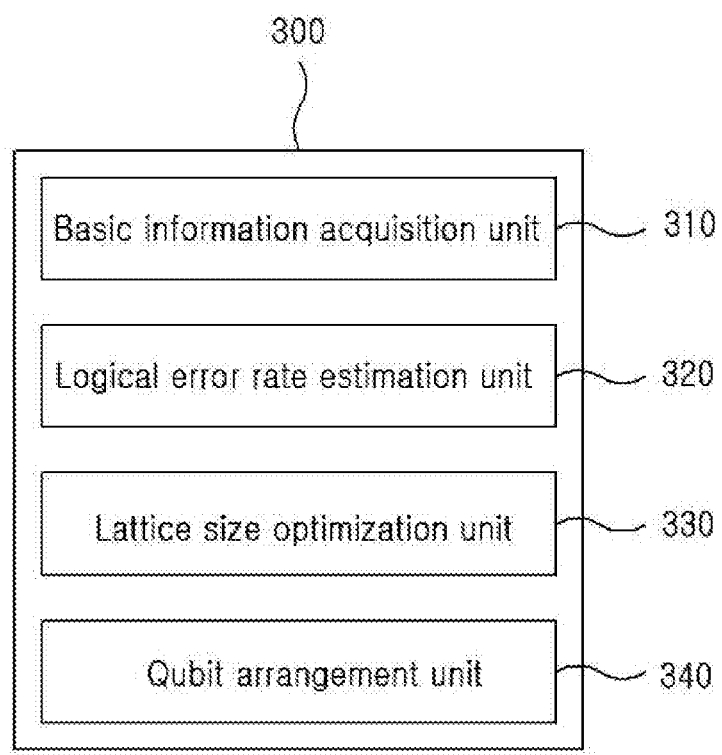
FIG. 3 is a flowchart for describing an example on a device of optimizing a biased error-based quantum error correction code to which the present disclosure may be applied.

FIG. 3 is a flowchart for describing an example on a device of optimizing a biased error-based quantum error correction code to which the present disclosure may be applied.

A quantum error correction code optimization device 300 according to the present disclosure may operate based on a biased error. An error correction code calculated in a quantum error correction code optimization device 300 may be linked to a device which performs quantum computing or quantum communication.

A quantum error correction code optimization device 300 may include a basic information acquisition unit 310, a logical error rate estimation unit 320, a lattice size optimization unit 330 and a qubit arrangement unit 340.

A basic information acquisition unit 310 may acquire at least one of a physical error rate ($p_{phy}$), a bias degree ($\eta$), a target logical error rate ($P_{f,target}$), size information of at least one candidate lattice, constants according to a data characteristic (e.g., $c_1, c_2, c_3, c_4, c_5, c_6, c_7$ and $c_8$ of Equation 2 or Equation 3), or a scope configuration value for a physical error rate (e.g., a first and second threshold value of Equation 2, and a third and fourth threshold value of Equation 3). Basic information may be calculated from information given or provided as a specific value by a user. Here, when a bias degree ($\eta$) exceeds 1, the at least one candidate lattice size may be defined as a rectangular form (i.e., $L_2 > L_1$) excluding a square. A logical error rate estimation unit 320 may estimate a logical X error rate (e.g., a logical X error rate ($P_{Lx}$) of Equation 2, and a logical Z error rate ($P_{Lz}$) of Equation 3) for each of at least one candidate lattice size by using at least a physical error rate ($p_{phy}$) and a bias degree ($\eta$) among basic information and estimate a logical error rate ($P_{fail}$) for each of at least one candidate lattice size based on it.

A lattice size optimization unit 330 may determine an optimal lattice size (e.g., $L_{1,opt}$ and $L_{2,opt}$) among at least one candidate lattice size by using a logical error rate ($P_{fail}$) estimated in a logical error rate estimation unit 320 and at least a target logical error rate ($P_{f,target}$) among basic information.

A qubit arrangement unit 340 may arrange a qubit based on an optimal lattice size determined in a lattice size optimization unit 330.

Figure 4:
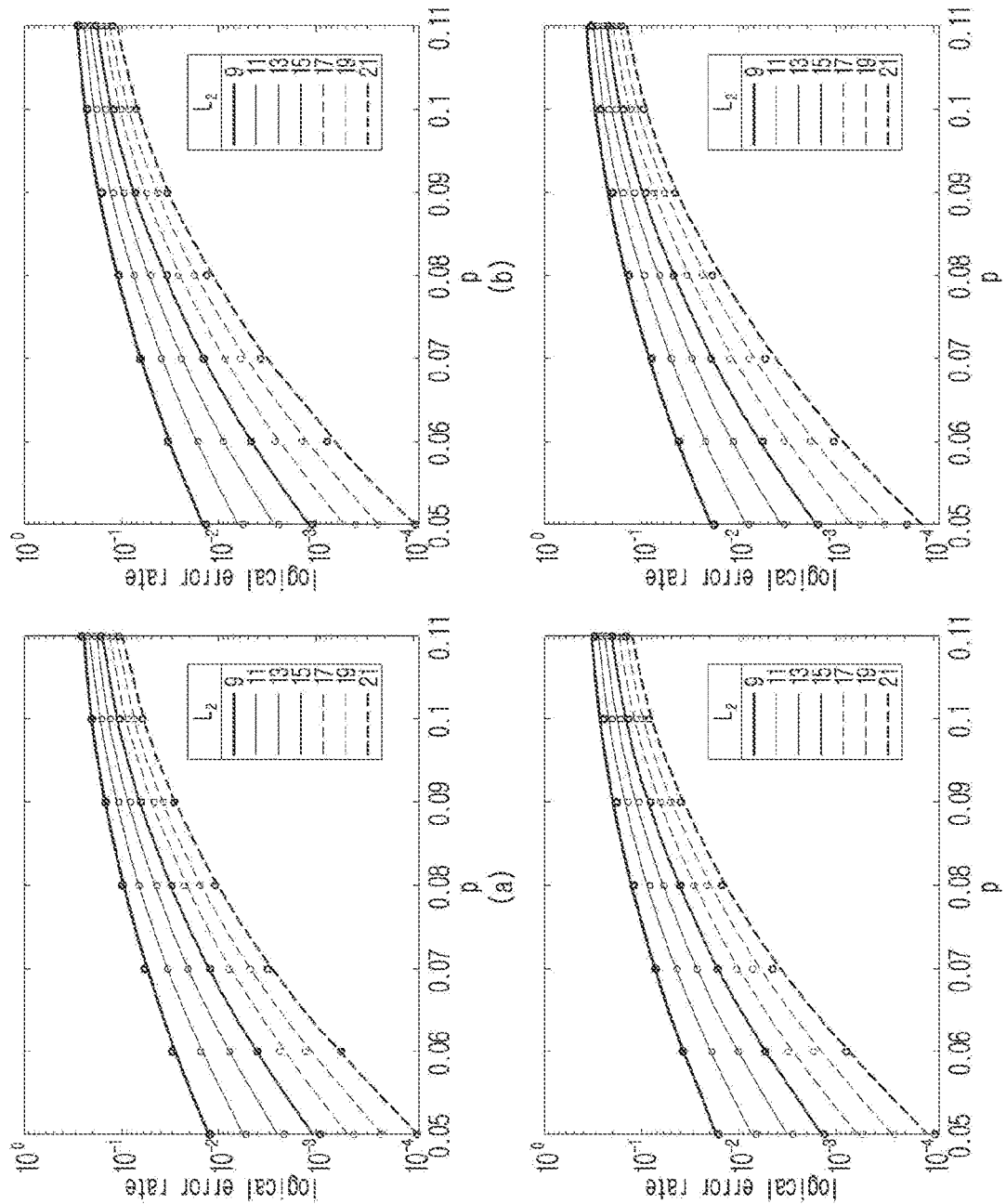
FIG. 4 is a diagram which represents an exemplary simulation result for a logical error rate estimation value per lattice size to which the present disclosure may be applied.

FIG. 4 is a diagram which represents an exemplary simulation result for a logical error rate estimation value per lattice size to which the present disclosure may be applied.

In examples of FIG. 4, a horizontal axis corresponds to a physical error rate and a vertical axis corresponds to a logical error rate. In examples of FIG. 4, a dot represents a data value, a simulation result and a line represents an estimation graph corresponding to a logical error rate value estimated according to Equation 2 and/or Equation 3. In examples of FIG. 4, a difference between a data value and an estimation graph value corresponds to an error.

As confirmed in a graph shown in FIG. 4, it may be seen that an error between a data value through simulation and a value estimated according to Equation 3 is within an allowable scope and that tendency is substantially the same. Accordingly, it may be confirmed that logical Z error rate estimation as in Equation 3 according to the present disclosure is appropriate.

FIG. 4(a) represents a simulation data value and an estimation error rate graph for cases in which $L_1$ is 15 and $L_2$ is 9, 11, 13, 14, 17, 19 or 21. FIG. 4(b) represents a simulation data value and an estimation error rate graph for cases in which $L_1$ is 17 and $L_2$ is 9, 11, 13, 14, 17, 19 or 21. FIG. 4(c) represents a simulation data value and an estimation error rate graph for cases in which $L_1$ is 19 and $L_2$ is 9, 11, 13, 14, 17, 19 or 21. FIG. 4(d) represents a simulation data value and an estimation error rate graph for cases in which $L_1$ is 21 and $L_2$ is 9, 11, 13, 14, 17, 19 or 21. As shown, it represents the lowest logical error rate in a case for $L_1 < L_2$ and in particular, it may be confirmed that as a physical error rate is higher, a logical error rate is much lower.

As such, an error between logical error rate data and an estimation graph value is not large and matches the overall tendency at a high physical error rate and a lattice size, so it may be confirmed that an estimation error rate is fully consistent with actual data.

Illustrative methods of the present disclosure are expressed as motion series for clarity of a description, but it is not to limit an order that a step is performed and if necessary, each step may be performed simultaneously or in a different order. To implement a method according to the present disclosure, other step may be additionally included in an illustrated step, or remaining steps except for some steps may be included, or an additional other step except for some steps may be included.

A variety of embodiments of the present disclosure do not enumerate all possible combinations, but are to describe a representative aspect of the present disclosure, and matters described in various embodiments may be independently applied or may be applied by at least two combinations.

In addition, a variety of embodiments of the present disclosure may be implemented by a hardware, a firmware, a software, or their combination, etc. For implementation by a hardware, implementation may be performed by one or more ASICs (Application Specific Integrated Circuits), DSPs (Digital Signal Processors), DSPDs (Digital Signal Processing Devices), PLDs (Programmable Logic Devices), FPGAs (Field Programmable Gate Arrays), general processors, controllers, microcontrollers, microprocessors, etc.

A scope of the present disclosure includes software or machine-executable commands (e.g., an operating system, an application, a firmware, a program, etc.) which execute an action according to a method of various embodiments in a device or a computer and a non-transitory computer-readable medium that such software or commands, etc. are stored and are executable in a device or a computer.

INDUSTRIAL APPLICABILITY

Examples of the present disclosure may be applied to a variety of error correction methods.

The invention claimed is:

1. A method for reducing an error rate of quantum error correction codes in a biased error environment using a quantum error correction code optimizing device implemented in hardware or in a combination of hardware and software and configured to reduce the error rate of quantum error correction codes, the method comprising:
- based on a physical error rate ($p_{phy}$) and a bias degree ($\eta$) exceeding 1, estimating a logical error rate ($P_{fail}$) for each of at least one candidate lattice size having a rectangular form excluding a square form, wherein the square form corresponds to a bias degree ($\eta$) of 1;
- based on the estimated logical error rate ($P_{fail}$) and a target logical error rate ($P_{f,target}$), determining an optimal lattice size among the at least one candidate lattice size having the rectangular form; and
- arranging qubits based on the optimal lattice size having the rectangular form excluding the square form,
- wherein a number of the qubits arranged to the optimal lattice size is smaller than a number of qubits for a lattice size having the square form, and
- wherein the quantum error correction codes with the reduced error rate are used for processing quantum information that is applied to overcome difficulties in implementing quantum computing and quantum information communication due to noise or errors in the quantum information.

2. The method of claim 1, wherein the at least one candidate lattice size is defined in a form that a minimum distance ($L_2$) of a logical Z operator is larger than the minimum distance ($L_1$) of the logical X operator.

3. The method of claim 2, wherein the optimal lattice size is determined based on $$\underset{L_1, L_2}{\text{argmin}}\ 2L_1 L_2 - L_1 - L_2 + 1$$

$$\text{s.t. } P_{fail} \leq P_{f,target}.$$

4. The method of claim 3, wherein:
the bias degree ($\eta$) is defined as $\eta = p_Z/p_X$, and
$p_Z$ is a physical Z error rate and $p_X$ is a physical X error rate.

5. The method of claim 4, wherein:
the estimated logical error rate ($P_{fail}$) is defined as $$P_{fail} = 1-(1-P_{Lz})(1-P_{Lx}) = P_{Lz} + P_{Lx} - P_{Lz} P_{Lx},$$

$P_{Lx}$ is a logical X error rate, and $P_{Lz}$ is a logical Z error rate.

6. The method of claim 5, wherein when the physical X error rate ($p_X$) is less than a first threshold value ($p_{X,low}$), the logical X error rate ($P_{Lx}$) is defined as $$L_2 \sqrt{\frac{2L_1}{\pi(L_1+1)^2} \times \left(\frac{4L_1^2}{L_1^2-1}\right)^{L_1}} \left(\frac{1}{\eta+1} p_{phy}\right)^{\lceil L_1/2 \rceil}.$$

7. The method of claim 5, wherein: when the physical X error rate ($p_X$) exceeds a second threshold value ($p_{X,high}$), the logical X error rate ($P_{Lx}$) is defined as $$\exp\left[\left(c_1\left(\frac{\eta}{\eta+1} p_{phy} - c_2\right)^2 + c_3\right)L_2\right] \times \Bigg[$$

$$\left(\frac{c_4 \eta}{\eta+1} p_{phy} + c_5\right)L_1 + c_6\left(\frac{\eta}{\eta+1} p_{phy} - c_7\right)^2 + c_8\Bigg],$$

and
$c_1, c_2, c_3, c_4, c_5, c_6, c_7$ and $c_8$ are a constant given based on a data characteristic.

8. The method of claim 5, wherein when the physical Z error rate ($p_Z$) is less than a third threshold value ($p_{Z,low}$), the logical Z error rate ($P_{Lz}$) is defined as $$L_1 \sqrt{\frac{2L_2}{\pi(L_2+1)^2} \times \left(\frac{4L_2^2}{L_2^2-1}\right)^{L_2}} \left(\frac{\eta}{\eta+1} p_{phy}\right)^{\lceil L_2/2 \rceil}.$$

9. The method of claim 5, wherein: when the physical Z error rate ($p_Z$) exceeds a fourth threshold value ($p_{Z,high}$), the logical Z error rate ($P_{Lz}$) is defined as $$\exp\left[\left(c_1\left(\frac{\eta}{\eta+1} p_{phy} - c_2\right)^2 + c_3\right)L_2\right] \times \Bigg[$$

$$\left(\frac{c_4 \eta}{\eta+1} p_{phy} + c_5\right)L_1 + c_6\left(\frac{\eta}{\eta+1} p_{phy} - c_7\right)^2 + c_8\Bigg],$$

and
$c_1, c_2, c_3, c_4, c_5, c_6, c_7$ and $c_8$ are a constant given based on a data characteristic.

10. The method of claim 1, wherein the quantum error correction codes are surface codes.

11. A quantum error correction code optimizing device implemented in hardware or in a combination of hardware and software and configured to reduce an error rate of quantum error correction codes in a biased error environment, the quantum error correction code optimizing device comprising:
- a basic information acquisition unit which acquires basic information including at least one of a physical error rate ($p_{phy}$), a bias degree ($\eta$), at least one candidate lattice size, or a target logical error rate ($P_{f,target}$);
- a logical error rate estimation unit which estimates a logical error rate ($P_{fail}$) for each of the at least one candidate lattice size based on the physical error rate ($p_{phy}$) and the bias degree ($\eta$) exceeding 1, the each of the at least one candidate lattice size having a rectangular form excluding a square form, wherein the square form corresponds to a bias degree ($\eta$) of 1;
- a lattice size optimization unit which determines an optimal lattice size among the at least one candidate lattice size having the rectangular form based on the estimated logical error rate ($P_{fail}$) and the target logical error rate ($P_{f,target}$); and
- a qubit arrangement unit which arranges a qubits based on the optimal lattice size having the rectangular form excluding the square form,
- wherein a number of the qubits arranged to the optimal lattice size is smaller than a number of qubits for a lattice size having the square form, and
- wherein the quantum error correction codes with the reduced error rate are used for processing quantum information that is applied to overcome difficulties in implementing quantum computing and quantum information communication due to noise or errors in the quantum information.

* * * * *